(12) United States Patent
Tsuchiya et al.

(10) Patent No.: US 7,672,092 B2
(45) Date of Patent: Mar. 2, 2010

(54) METHOD FOR MANUFACTURING MAGNETIC FIELD DETECTING ELEMENT, UTILIZING DIFFUSION OF METAL

(75) Inventors: Yoshihiro Tsuchiya, Tokyo (JP); Tomohito Mizuno, Tokyo (JP); Kei Hirata, Tokyo (JP); Keita Kawamori, Tokyo (JP); Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 535 days.

(21) Appl. No.: 11/708,537

(22) Filed: Feb. 21, 2007

(65) Prior Publication Data

US 2007/0291422 A1  Dec. 20, 2007

(30) Foreign Application Priority Data

Jun. 14, 2006  (JP)  .............................. 2006-164574

(51) Int. Cl.
*G11B 5/127* (2006.01)
(52) U.S. Cl. ................................. 360/324.12
(58) Field of Classification Search .............. 360/324.1, 360/324.12, 326; 428/811
See application file for complete search history.

(56) References Cited

U.S. PATENT DOCUMENTS

| | | | |
|---|---|---|---|
| 7,336,453 B2* | 2/2008 | Hasegawa et al. | 360/324.12 |
| 2003/0137785 A1 | 7/2003 | Saito et al. | |
| 2006/0044703 A1 | 3/2006 | Inomata et al. | |
| 2006/0285258 A1* | 12/2006 | Nishimura et al. | 360/324.1 |
| 2007/0274010 A1* | 11/2007 | Hirata et al. | 360/324.11 |
| 2007/0297103 A1* | 12/2007 | Zhang et al. | 360/324.12 |
| 2007/0297104 A1* | 12/2007 | Mizuno et al. | 360/324.12 |
| 2008/0112095 A1* | 5/2008 | Carey et al. | 360/324.12 |
| 2008/0144235 A1* | 6/2008 | Gill | 360/324.12 |

FOREIGN PATENT DOCUMENTS

| | | |
|---|---|---|
| JP | A-2001-216614 | 8/2001 |
| JP | A-2002-270790 | 9/2002 |
| JP | A-2003-060263 | 2/2003 |
| JP | A-2003-174217 | 6/2003 |
| JP | 2003-218428 | 7/2003 |
| JP | 2004-221526 | 8/2004 |
| JP | A-2005-116701 | 4/2005 |
| JP | A-2005-223193 | 8/2005 |

OTHER PUBLICATIONS

Yuasa, H., et al. "Effect of Inserted Cu on current-perpendicular-to-plane-giant magnetoresistance of $Fe_{50}Co_{50}$ spin valves." Journal of Applied Physics, USA, American Institute of Physics, May 15, 2003, vol. 93; No. 10. pp. 7915-7917.

* cited by examiner

*Primary Examiner*—Angel A. Castro
(74) *Attorney, Agent, or Firm*—Oliff & Berridge, PLC (57) ABSTRACT

A method for manufacturing a magnetic field detecting element has the steps of: forming stacked layers by sequentially depositing a pinned layer, a spacer layer, a spacer adjoining layer which is adjacent to the spacer layer, a metal layer, and a Heusler alloy layer in this order, such that the layers adjoin each other; and heat treating the stacked layers in order to form the free layer out of the spacer adjoining layer, the metal layer, and the Heusler alloy layer. The spacer adjoining layer is mainly formed of cobalt and iron, and has a body centered cubic structure, and the metal layer is formed of an element selected from the group consisting of silver, gold, copper, palladium, or platinum, or is formed of an alloy thereof.

14 Claims, 9 Drawing Sheets

METHOD FOR MANUFACTURING MAGNETIC FIELD DETECTING ELEMENT, UTILIZING DIFFUSION OF METAL

This Application is a U.S. Utility Patent Application which claims foreign priority from Japanese Application No. 2006-164574, filed Jun. 14, 2006, the complete disclosure of which is incorporated herein by reference.

BACKGROUND OF THE INVENTION

1. Field of the Invention

The present invention relates to a magnetic field detecting element which is used in a hard disk drive, and particularly to a method for manufacturing a magnetic field detecting element.

2. Description of the Related Art

A spin-valve type GMR (Giant Magneto-Resistive) head is known as a magnetic head which meets requirements for high sensitivity and high output. A magnetic field detecting element that is used in a spin-valve type GMR head has a free layer and a pinned layer. These layers are stacked with a non-magnetic spacer layer interposed therebetween. The free layer is made of a ferromagnetic material, and the magnetization direction changes in accordance with an external magnetic field. The pinned layer is made of a ferromagnetic material, and the magnetization direction is fixed with respect to the external magnetic field. The magnetization direction of the free layer forms a relative angle relative to the magnetization direction of the pinned layer in accordance with the external magnetic field, and spin dependent scattering of conduction electrons varies in accordance with the relative angle so as to produce a change in magneto-resistance. A magnetic head detects the change in magneto-resistance, and reads magnetic information on a recording medium.

The pinned layer may be constructed as a so-called synthetic pinned layer. A synthetic pinned layer has an outer pinned layer whose magnetization direction is fixed with respect to an external magnetic field, an inner pinned layer which is disposed closer to the spacer layer than the outer pinned layer, and a non-magnetic intermediate layer sandwiched between the outer pinned layer and inner pinned layer. The magnetization direction of the inner pinned layer is firmly fixed due to anti-ferromagnetic coupling with the outer pinned layer. Further, since magnetic moments of the outer pinned layer and inner pinned layer cancel each other out, leakage of magnetic field is limited as a whole.

Among many types of GMR heads, a CPP (Current Perpendicular to the Plane) GMR head, in which sense current flows in a direction perpendicular to layer surfaces, has been investigated recently because of the potential of higher output. A CPP-GMR head is also advantageous in that improved heat dissipation efficiency, which is caused by the arrangement in which the magnetic field detecting element is coupled to shield layers via metal layers, allows large operating current. In a CPP-GMR head, magneto-resistance, as well as electric resistance, is increased in accordance with a reduction in the cross-sectional area of the magnetic field detecting element. In other words, a CPP-GMR head has a further advantage that it is more suitable for a narrow track width.

The change in magneto-resistance is increased in accordance with an increase in the spin polarizability of the free layer and pinned layer. Accordingly, a free layer and a pinned layer which are made of materials having large spin polarizabilities enable a further increase in magneto-resistance (MR ratio) and in output. A magnetic material having a spin polarizability of 100% or approximately 100% is called half metal.

A Heusler alloy is known as a material which realizes the half metal. In recent years, it has been proposed to use the Heusler alloy for the free layer and pinned layer, instead of a CoFe alloy or a NiFe alloy which have conventionally been used. For example, Japanese Patent Laid-Open Publication No. 2003-218428 discloses a technique for using $Co_2MnZ$ (Z is an element selected from the group consisting of Al, Si, Ga, Ge, Sn) for a magnetic field detecting element in a CPP-GMR head. Japanese Patent Laid-Open Publication No. 2004-221526 discloses a technique for using $Co_2$ ($Fe_xCr_{1-x}$)Al for a magnetic field detecting element in a TMR (Tunnel Magneto-Resistive) head and in a CPP-GMR head.

Although a CPP-GMR head having the Heusler alloy exhibits a relatively large MR ratio due to high polarizability, as mentioned above, it has the disadvantage that it has large magneto striction and is unstable as a magnetic field detecting element when the Heusler alloy is used for a free layer. Specifically, an end surface of a magnetic head is exposed to a recording medium that is opposite to the magnetic head under a stress state that is induced by other layers, such as the over-coat layer. Therefore, the symmetry of stress is lost, and tension stress is generated in the element along a height direction, which is a direction that is perpendicular to the air bearing surface. For this reason, if magneto striction is increased in the free layer, then magnetic elastic energy is increased, and large anisotropy is induced in the free layer along the height direction of the element. The free layer generally responds linearly about the track width direction. However, if the free layer exhibits large magneto striction and resultant large anisotropy along the height direction of the element, then the linear response is impeded, leading to unstable operation as an element. For this reason, magneto striction is preferably limited to no more than approximately $+3 \times 10^{-6}$. However, the Heusler alloy often exhibits a magneto striction that exceeds $+10 \times 10^{-6}$.

SUMMARY OF THE INVENTION

An object of the present invention is to provide a magnetic field detecting element for a CPP-GMR head which has low magneto striction and potential for a large MR ratio. Another object of the present invention is to provide a method for manufacturing the same.

According to the present invention, a method for manufacturing a magnetic field detecting element having a free layer whose magnetization direction changes in accordance with an external magnetic field, a pinned layer whose magnetization direction is fixed with respect to the external magnetic field, and a non-magnetic spacer layer which is interposed between the free layer and the pinned layer, wherein sense current is adapted to flow in a direction that is perpendicular to layer surfaces, is provided. The method comprises the steps of: forming stacked layers by sequentially depositing the pinned layer, the spacer layer, a spacer adjoining layer which is adjacent to the spacer layer, a metal layer, and a Heusler alloy layer in this order, such that the layers adjoin each other; and heat treating the stacked layers in order to form the free layer out of the spacer adjoining layer, the metal layer, and the Heusler alloy layer. The spacer adjoining layer is mainly formed of cobalt and iron, and has a body centered cubic structure, and the metal layer is formed of an element selected from the group consisting of silver, gold, copper, palladium, or platinum, or is formed of an alloy thereof.

The metal layer, which is inserted between the spacer adjoining layer and the Heusler alloy layer, is diffused into the spacer adjoining layer through heat treatment. The diffusion of the metal promotes reduction in magneto striction at the boundary between the spacer adjoining layer and the Heusler alloy layer, and thus limits magneto striction of the Heusler alloy layer. This phenomenon is facilitated if the spacer adjoining layer has a body centered cubic structure. The inventors think that the spacer adjoining layer having the body centered cubic structure better matches the Heusler alloy layer with regard to the crystal structure, and does not provide as good a match with the metal layer, and therefore, that the metal layer is diffused toward the spacer adjoining layer without being impeded by lattice structure, and as a result, that magneto striction at the boundary is limited.

The metal layer preferably has a thickness between 0.2 nm and 1.2 nm.

An atomic percent of cobalt in the spacer adjoining layer is preferably more than 0% and is equal to or less than 75%.

According to another embodiment of the present invention, a magnetic field detecting element comprises: a free layer whose magnetization direction changes in accordance with an external magnetic field; a pinned layer whose magnetization direction is fixed with respect to the external magnetic field; and a non-magnetic spacer layer which is sandwiched between the free layer and the pinned layer. Sense current is adapted to flow in a direction that is perpendicular to layer surfaces. The free layer comprises: a spacer adjoining layer; and a Heusler alloy layer, wherein the spacer adjoining layer is sandwiched between the spacer layer and the Heusler alloy layer, wherein the spacer adjoining layer is mainly formed of cobalt and iron, and has a body centered cubic structure, and wherein the spacer layer contains an element selected from the group consisting of silver, gold, copper, palladium, or platinum, or an alloy thereof, wherein the element or the alloy was diffused from a region between the spacer adjoining layer and the Heusler alloy layer.

The Heusler alloy layer may be adjacent to the spacer adjoining layer.

The magnetic field detecting element may further comprises a metal layer between the Heusler alloy layer and the spacer adjoining layer, the metal layer containing an element selected from the group consisting of silver, gold, copper, palladium, or platinum, or an alloy thereof.

An atomic percent of cobalt in the spacer adjoining layer is preferably more than 0% and is equal to or less than 75%.

According to another embodiment of the present invention, a slider comprises the above-mentioned magnetic field detecting element.

According to another embodiment of the present invention, a wafer which is used to manufacture the slider is provided with at least one of the above-mentioned magnetic field detecting elements.

According to another embodiment of the present invention, a head gimbal assembly comprises: the above-mentioned slider which is configured to be arranged opposite to a recording medium; and a suspension for resiliently supporting the slider.

According to another embodiment of the present invention, a hard disk drive comprises: the above-mentioned slider which is configured to be arranged opposite to a disc-shaped recording medium that is rotatably driven; and a positioning device for supporting the slider and for positioning the slider relative to the recording medium.

As described above, the present invention can provide a magnetic field detecting element for a CPP-GMR head which has low magneto striction and potential for a large MR ratio, and a method for manufacturing the same.

The above and other objects, features and advantages of the present invention will become apparent from the following description with reference to the accompanying drawings which illustrate examples of the present invention.

DETAILED DESCRIPTION OF THE INVENTION

An embodiment of a thin-film magnetic head using a magnetic field detecting element of the present invention will be described with reference to the drawings. The following embodiment will be described with regard to a thin-film magnetic head that is used for a hard disk drive. However, the magnetic field detecting element of the present invention can also be applied to a magnetic memory element and a magnetic sensor assembly.

Figure 1:
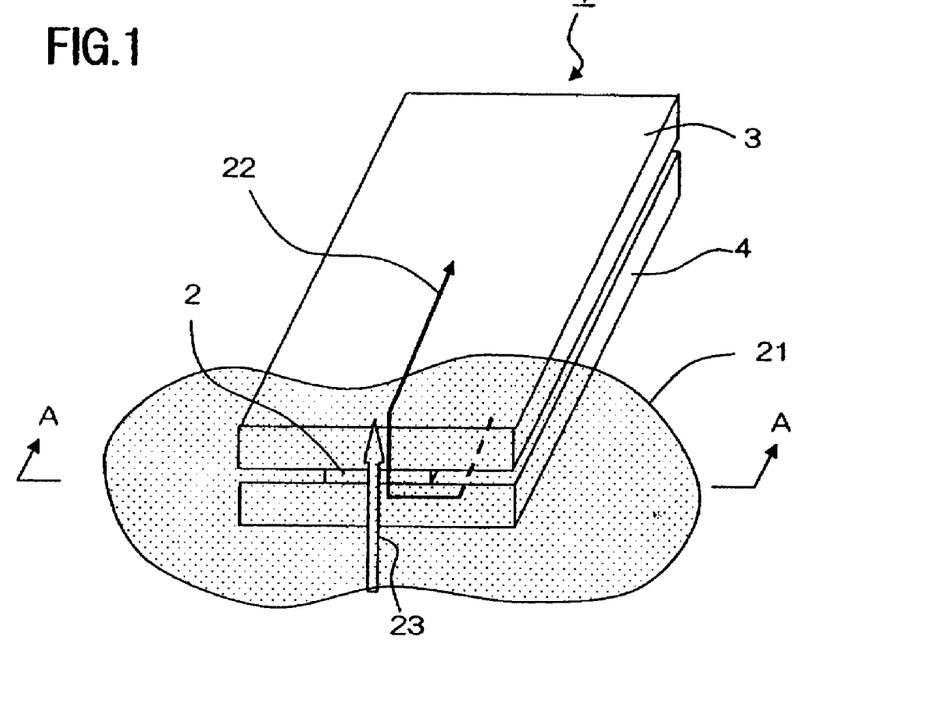
FIG. 1 is a partial perspective view of a thin-film magnetic head which employs a magnetic field detecting element of the present invention.

FIG. 1 is a partial perspective view of a thin-film magnetic head which uses a magnetic field detecting element of the present invention. Thin-film magnetic head 1 may be a read only head, or may be an MR/inductive composite head which additionally has a write head portion. Magnetic field detecting element 2 is disposed between upper electrode/shield 3 and lower electrode/shield 4, with the leading end thereof located opposite to recording medium 21. Magnetic field detecting element 2 is adapted such that sense current 22 flows in a direction that is perpendicular to layer surfaces under a voltage that is applied between upper electrode/shield 3 and lower electrode/shield 4. The magnetic field of recording medium 21 at the location opposite to magnetic field detecting element 2 changes in accordance with the rotational movement of recording medium 21 along moving direction 23 of recording medium 21. Magnetic field detecting element 2 detects the change in magnetic field as a change in electric resistance of sense current 22, which is produced by the GMR effect, so as to read magnetic information that is written in each magnetic domain of recording medium 21.

Figure 2:
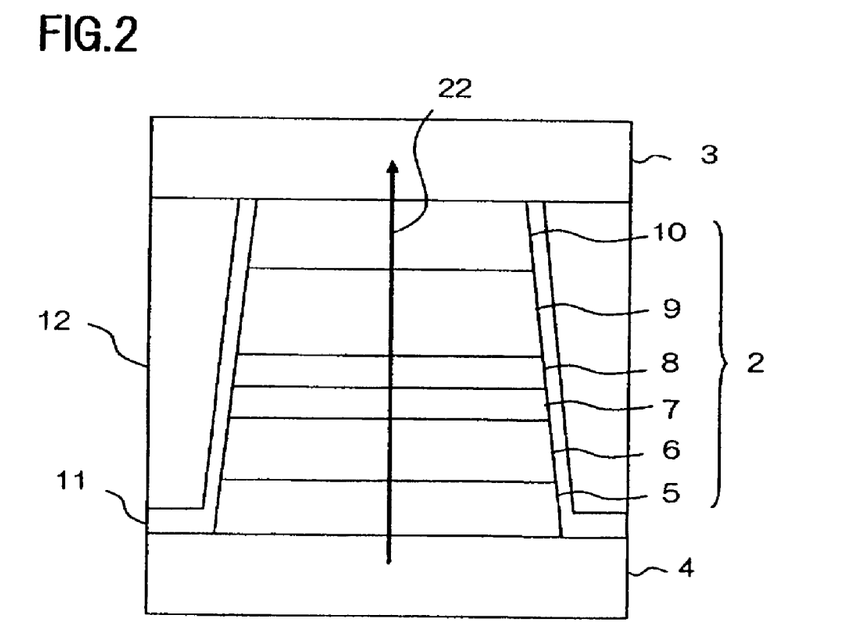
FIG. 2 is a side view of the magnetic field detecting element, viewed from A-A direction in FIG. 1.

FIG. 2 is a side view of the magnetic field detecting element, viewed from A-A direction, i.e., from the side of the air bearing surface in FIG. 1. The air bearing surface means the surface of thin-film magnetic head 1 that is opposite to recording medium 21. Table 1 shows an exemplary layer configuration of magnetic field detecting element 2. In Table 1, the layers from buffer layer 5 in the bottom row, which is in contact with lower electrode/shield 4, to cap layer 10 in the top row, which is in contact with upper electrode/shield 3, are shown in the order of stacking. In the description and tables, a notation such as Co70Fe30 means the atomic percent of the element (the unit of the numeral is percent). However, a trace of other elements may be added, as long as equivalent magnetic characteristics are ensured. In other words, each layer needs not strictly consist of the elements that are denoted in the formula alone.

TABLE 1

| | Layer Configuration | Composition |
|---|---|---|
| | Cap Layer 10 | Ru |
| Free Layer 9 | Heusler Alloy Layer 93 | $Co_2MnSi$ or $Co_2MnGe$ |
| | Spacer Adjoining Layer 91 | Co70Fe30 |
| | Spacer Layer 8 | Cu |
| Pinned Layer 7 | Inner Pinned Layer 73 | FeCo |
| | | $Co_2MnSi$ or $Co_2MnGe$ |
| | | CoFe |
| | Non-magnetic Intermediate Layer 72 | Ru |
| | Outer Pinned Layer 71 | FeCo |
| | Anti-ferromagnetic Layer 6 | IrMn |
| | Buffer Layer 5 | Ru |
| | | Ta |

Magnetic field detecting element 2 has a structure of stacked layers which has buffer layer 5 that is made of Ta/Ru, anti-ferromagnetic layer 6 that is made of IrMn, pinned layer 7, spacer layer 8 that is made of Cu, free layer 9, and cap layer 10. These layers are stacked in this order on lower electrode/shield 4. Lower electrode/shield 4 is made of NiFe, and has a thickness of approximately 2 μm. In this specification, the notation $A_1/\ldots/A_n$ generally means a structure of stacked layers in which layers $A_1$ to $A_n$ are deposited in the order of $A_1$ to $A_n$. The layer configuration of buffer layer 5 is selected such that good exchange-coupling with anti-ferromagnetic layer 6 is obtained. The Cu layer that constitutes spacer layer 8 may contain a slight amount of an additive element as long as Cu is contained as the main element in spacer layer 8. Spacer layer 8 contains silver which was diffused from the region between spacer adjoining layer 91 and Heusler alloy layer 93. Cap 1 layer 10, which is made of Ru, is provided to prevent deterioration of the layers that are deposited therebelow. Upper electrode/shield layer 3 is formed on cap layer 10. Upper electrode/shield layer 3 is made of NiFe, and has a thickness of approximately 2 μm. Hard bias layers 12 are formed on both sides of magnetic field detecting element 2 via insulating layers 11. Hard bias layers 12 control the magnetic domains of free layer 9 so that free layer 9 has a single magnetic domain. Insulating layers 11 are made of $Al_2O_3$. Hard bias layers 12 are made of, for example, CoPt, or CoCrPt.

Pinned layer 7 is a layer whose magnetization direction is fixed with respect to an external magnetic field. In this embodiment, pinned layer 7 is a so-called synthetic pinned layer. Specifically, pinned layer 7 consists of outer pinned layer 71, inner pinned layer 73 that is disposed closer to spacer layer 8 than outer pinned layer 71, and non-magnetic intermediate layer 72 that is sandwiched between outer pinned layer 71 and inner pinned layer 73. In the synthetic pinned layer, since outer pinned layer 71 and inner pinned layer 73 are anti-ferromagnetically coupled via non-magnetic intermediate layer 72, the magnetization state is stably maintained and effective magnetization of entire pinned layer 7 is limited.

Outer pinned layer 71 is made of FeCo in order to ensure sufficient exchange coupling strength with anti-ferromagnetic layer 6. Inner pinned layer 73 consists of stacked layers of CoFe/Heusler alloy/CoFe. The Heusler alloy is made of, for example, $Co_2MnSi$, or $Co_2MnGe$. However, the Heusler alloy is not limited to these compositions, and more generally, may be made of a material that is represented by the composition formula of $X_2YZ$ (where X is an element selected from 3A to 2B groups in the periodic table of elements, Y is an element selected from the group consisting of manganese (Mn), iron (Fe), and chrome (Cr), and Z is one or more elements selected from the group consisting of aluminum (Al), silicon (Si), gallium (Ga), germanium (Ge), indium (In), tin (Sn), thallium (Ti), lead (Pb), and antimony (Sb)). Non-magnetic intermediate layer 72 is made of Ru in order to ensure anti-ferromagnetic coupling between outer pinned layer 71 and inner pinned layer 73.

Free layer 9 is a layer whose magnetization direction changes in accordance with an external magnetic field. Free layer 9 has spacer adjoining layer 91, and Heusler alloy layer 93. Spacer adjoining layer 91 is a layer that is made of a cobalt-iron alloy of 70Co30Fe and that has a body centered cubic (bcc) structure. The bcc structure is essential for spacer adjoining layer 91. Therefore, the atomic percent of Co in spacer adjoining layer 91 is not limited to 70% as long as spacer adjoining layer 91 has a bcc structure. Heusler alloy layer 93 is disposed adjacent to spacer adjoining layer 91 and sandwiches spacer adjoining layer 91 together with spacer layer 8. Although not listed in Table 1, a silver layer may exist between Heusler alloy layer 93 and spacer adjoining layer 91. Spacer layer 8 may contain gold, copper, palladium, or platinum, or an alloy that includes at least two of the metals of silver, gold, copper, palladium, and platinum, instead of silver. Also, the silver layer described above may be replaced with a layer of gold, copper, palladium, or platinum, or a layer of an alloy that includes at least two of the metals of silver, gold, copper, palladium, and platinum.

In order to manufacture the thin-film magnetic head described above, first, lower electrode/shield 4 is formed on a substrate, not shown, made of a ceramic material, such as AlTiC ($Al_2O_3.TiC$), via an insulating layer, not shown. Next, the layers from buffer layer 5 to spacer layer 8 are sequentially deposited by means of sputtering. Next, spacer adjoining layer 91 is deposited, and then a silver layer, which is metal layer 92, is deposited on spacer adjoining layer 91. Heusler alloy layer 93 is then deposited on metal layer 92, and cap layer 10 is deposited on Heusler alloy layer 93. Subsequently, the layers from buffer layer 5 to cap layer 10 are patterned into appropriate dimensions. Table 2 shows the layer configuration when the foregoing deposition step has been completed. Subsequently, the entire substrate on which the above-described layers are deposited is heat-treated (annealed). When a write head portion is provided, elements, such as a write magnetic pole layer and a coil are further stacked. Subsequently, the entire layers are covered with a protection layer, and the wafer is diced, lapped and separated into sliders. Each slider has a thin-film magnetic head formed thereon.

Figure 3:
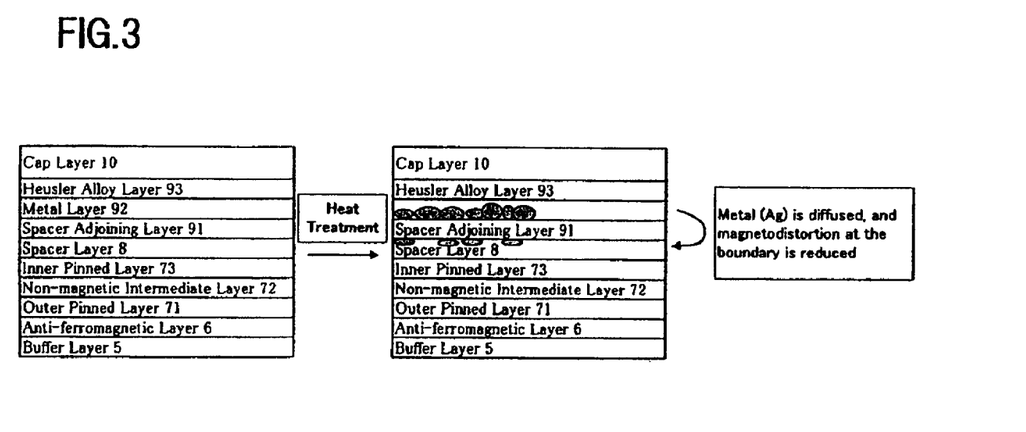
FIG. 3 is a schematic diagram showing the diffusion of silver.

The present invention is characterized by the step of depositing Heusler alloy layer 93 via metal layer 92 after depositing spacer adjoining layer 91. Silver, which constitutes metal layer 92, is diffused into spacer layer 8 via spacer adjoining layer 91 by heat-treating the substrate, as schematically illustrated in FIG. 3. This phenomenon occurs because silver is less apt to form a solid solution in adjoining Heusler alloy layer 93 and in spacer adjoining layer 91, and accordingly, silver is diffused into spacer layer 8, in which silver is more apt to form a solid solution, via spacer adjoining layer 91.

However, it should be noted that all of the silver which constitutes metal layer 92 is not diffused into spacer layer 8, and that part of the silver may remain in metal layer 92, depending on the thickness of metal layer 92 and on the annealing conditions. Silver that is diffused is not uniformly distributed in spacer layer 8, but is concentrated on the surface region that is adjacent to spacer adjoining layer 91. The inventors think that the reduction in magneto striction at the boundary between spacer adjoining layer 91 and Heusler alloy layer 93 is caused by the diffusion of silver. As previously described, metal layer 92 may also be formed by depositing gold, copper, palladium, or platinum, or by depositing an alloy which contains at least two of the metals of silver, gold, copper, palladium, and platinum, instead of silver. These metals are common to silver in that they are less apt to form a solid solution in Heusler alloy layer 93 and in spacer adjoining layer 91, and are more apt to form a solid solution in space layer 8, and in that they are apt to be diffused.

TABLE 2

| Layer Configuration | | Composition | Layer Thickness (nm) |
|---|---|---|---|
| | Cap layer 10 | Ru | 10 |
| Free Layer 9 | Heusler Alloy Layer 93 | Parameter 2 | 4 |
| | Metal Layer 92 | Parameter 4 | Parameter 3 |
| | Spacer Adjoining Layer 91 | Parameter 1 | 1 |
| | Spacer Layer 8 | Cu | 2 |
| Pinned Layer | Inner | FeCo | 1 |
| | Pinned Layer 73  Heusler alloy layer 93 | Parameter 2 | 3 |
| | | CoFe | 1 |
| | Non-magnetic Intermediate Layer 72 | Ru | 0.8 |
| | Outer Pinned Layer 71 | FeCo | 3 |
| Anti-ferromagnetic Layer 6 | | IrMn | 5 |
| Buffer Layer 5 | | Ru | 2 |
| | | Ta | 1 |

Next, investigations were conducted to study the influence of the four parameters that are shown in Table 2 and the annealing temperature on magneto striction and the MR ratio. In the experiments below, the junction was 0.2 μm×0.2 μm.

(Experiment 1)

Figure 4:
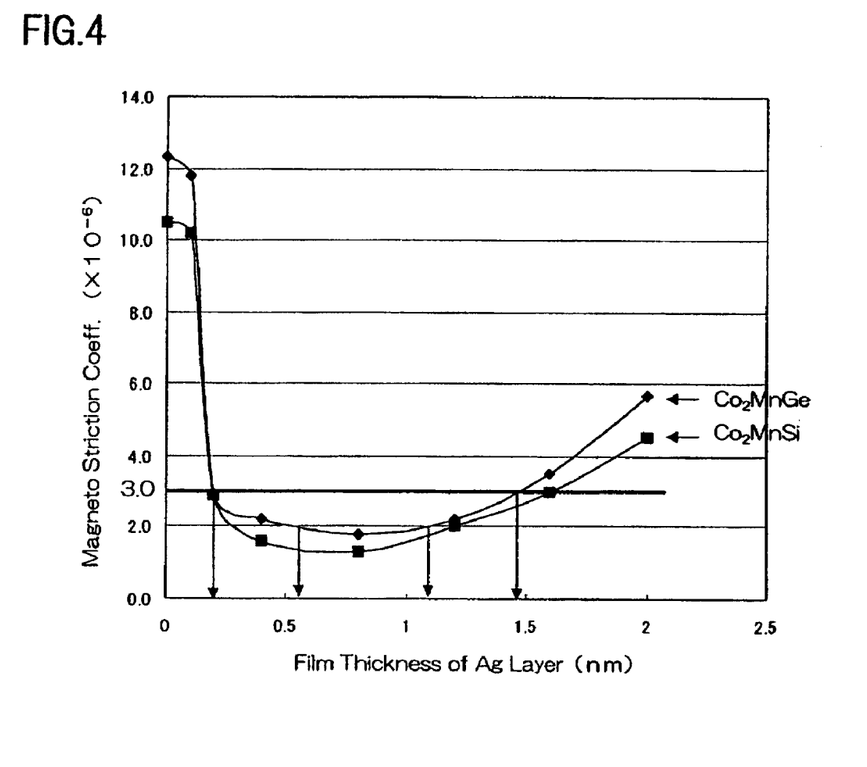
FIGS. 4 and 5 are graphs showing the result of Experiments 1 and 2, respectively.

First, influence of the thickness of metal layer 92 on magneto striction and the MR ratio were investigated. Silver was used for metal layer 92. $Co_2MnSi$ and $Co_2MnGe$ were used for Heusler alloy metal 93, and CoFe was used for spacer adjoining layer 91. As shown in Table 3 and FIG. 4, the magneto striction coefficient was limited to less than $+3\times10^{-6}$ by inserting a silver layer having a thickness of approximately 0.2 nm or more, whereas the magneto striction coefficient exceeded $+10\times10^{-6}$ when a silver layer was not provided. The inventors think that this is because magneto striction is reduced at the boundary between spacer adjoining layer 9 and Heusler alloy layer 93 because of the effect of inserting a silver layer, as mentioned above. However, the magneto striction coefficient was found to be increased again when the thickness was further increased. This is because a large amount of silver remains in the silver layer due to excessive thickness of the silver layer. The MR ratio is not largely influenced by the presence or absence of the silver layer, or by the thickness of the silver layer, although the MR ratio tends to be increased when magneto striction is reduced. In general, the preferable range of the magneto striction coefficient is no more than $+3\times10^{-6}$, and more preferably, no more than $+2\times10^{-6}$. Accordingly, in order to achieve magneto striction coefficient that is no more than $3\times10^{-6}$ in the case of $Co_2MnSi$ and $Co_2MnGe$, the thickness of the silver layer has to be equal to or more than 0.2 nm and equal to or less than 1.4 nm. Further, in order to achieve magneto striction coefficient that is no more than $2\times10^{-6}$ the thickness of the silver layer has to be equal to or more than 0.6 nm and equal to or less than 1.1 nm.

TABLE 3

| Experiment. No. | Spacer Adjoining Layer 91 | Metal Layer 92 Material | Thickness (nm) | Heusler Alloy Layer 93 | Annealing Temp. (K) | Magneto striction Coefficient ($\times10^{-6}$) | MR Ratio (%) |
|---|---|---|---|---|---|---|---|
| 1-1 | 70CoFe | Ag | 0 | $Co_2MnSi$ | 563 | 10.5 | 7.2 |
| 1-2 | | | 0.1 | | | 10.2 | 7.3 |
| 1-3 | | | 0.2 | | | 2.9 | 7.3 |
| 1-4 | | | 0.4 | | | 1.6 | 7.9 |
| 1-5 | | | 0.8 | | | 1.3 | 8.0 |
| 1-6 | | | 1.2 | | | 2.0 | 7.8 |
| 1-7 | | | 1.6 | | | 3.0 | 7.5 |
| 1-8 | | | 2 | | | 4.5 | 7.0 |
| 2-1 | 70CoFe | Ag | 0 | $Co_2MnGe$ | 563 | 12.3 | 7.5 |
| 2-2 | | | 0.1 | | | 11.8 | 7.6 |
| 2-3 | | | 0.2 | | | 3.0 | 7.7 |
| 2-4 | | | 0.4 | | | 2.2 | 7.9 |
| 2-5 | | | 0.8 | | | 1.8 | 8.0 |
| 2-6 | | | 1.2 | | | 2.2 | 8.0 |
| 2-7 | | | 1.6 | | | 3.5 | 7.5 |
| 2-8 | | | 2 | | | 5.7 | 6.9 |

(Experiment 2)

Figure 5:
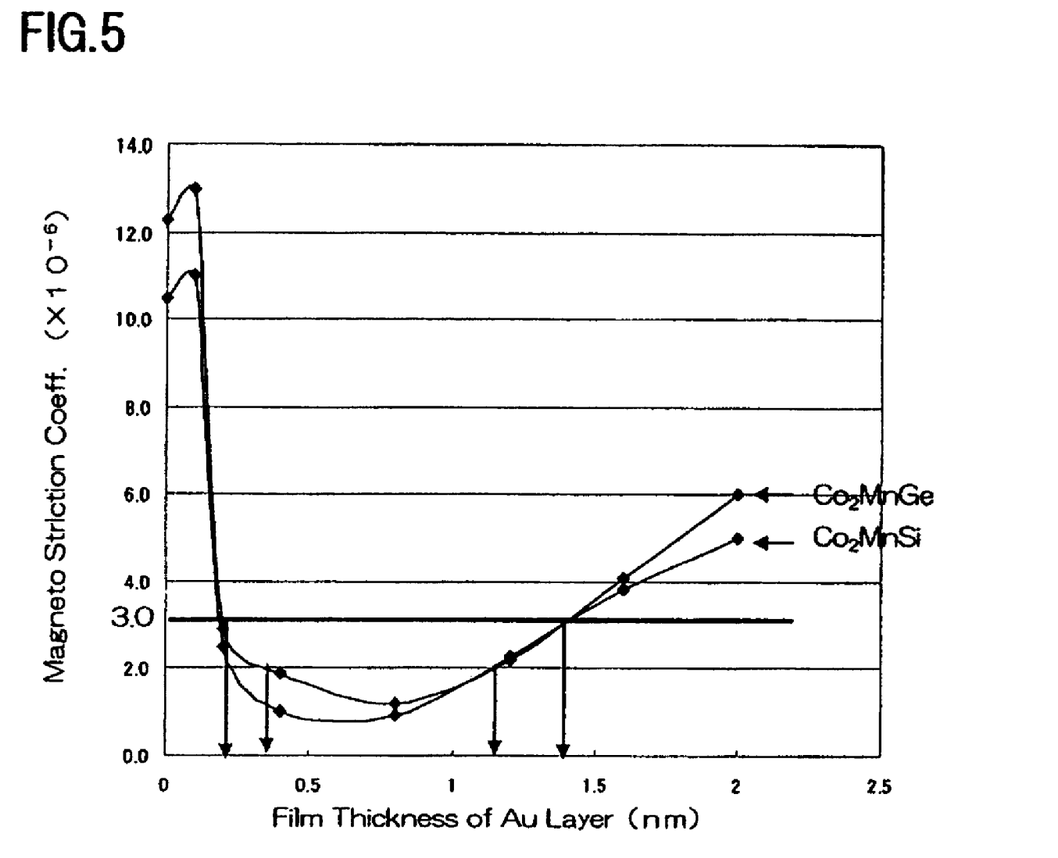

An experiment that is similar to Experiment 1 was conducted using gold for metal layer 92. As shown in Table 4 and FIG. 5, the magneto striction coefficient was more than +10× $10^{-6}$ when a gold layer was not provided. However, the magneto striction coefficient was less than +3×$10^{-6}$ when a gold layer having a thickness of approximately 0.2 nm or more was inserted. However, as the thickness was further increased, the magneto striction coefficient was found to be increased again. In this way, the general tendency was similar to the case in which silver was used. In order to achieve magneto striction coefficient that is no more than 3×$10^{-6}$ in the case of $Co_2MnSi$ and $Co_2MnGe$, the thickness of the gold layer has to be equal to or more than 0.2 nm and equal to or less than 1.4 nm. Further, in order to achieve a magneto striction coefficient that is no more than 2×$10^{-6}$, the thickness of the gold layer has to be equal to or more than 0.3 nm and equal to or less than 1.1 nm.

showing the magneto striction coefficient in relation to the atomic percent of Co, which is shown in the horizontal axis, when metal layer 92 was made of a silver layer having a thickness of 0 to 0.8 nm, and when Heusler alloy layer 93 was made of $Co_2MnSi$. FIG. 7 is a graph that is similar to FIG. 6 that shows the magneto striction coefficient in relation to the thickness of the silver layer, which is shown in the horizontal axis.

Figure 6:
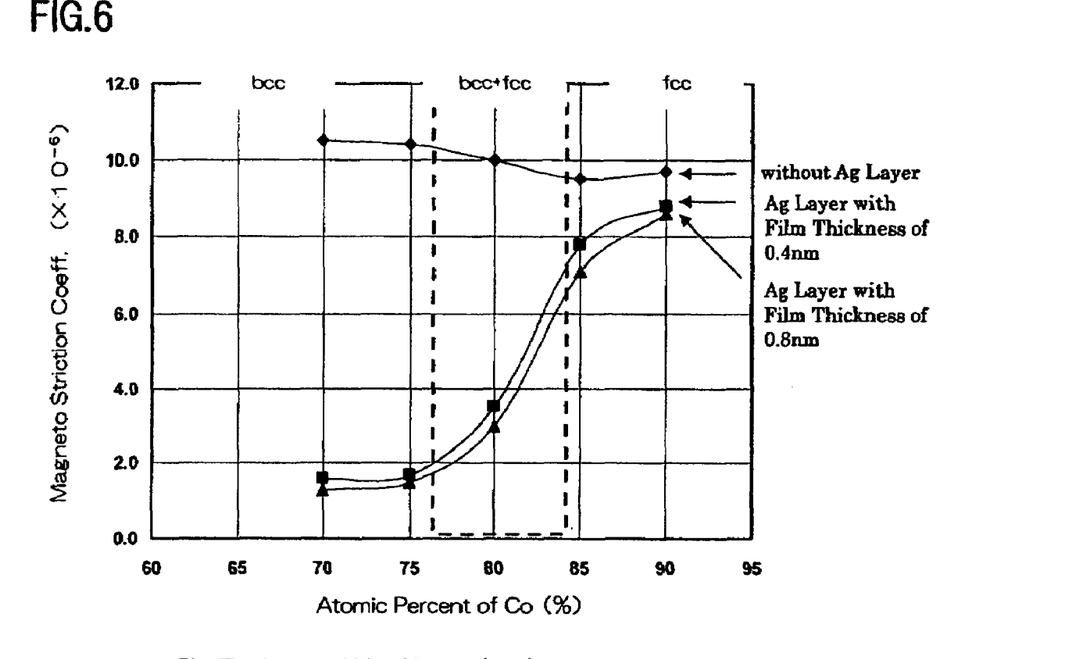
FIGS. 6 and 7 are graphs showing the result of Experiment 3.
Figure 7:
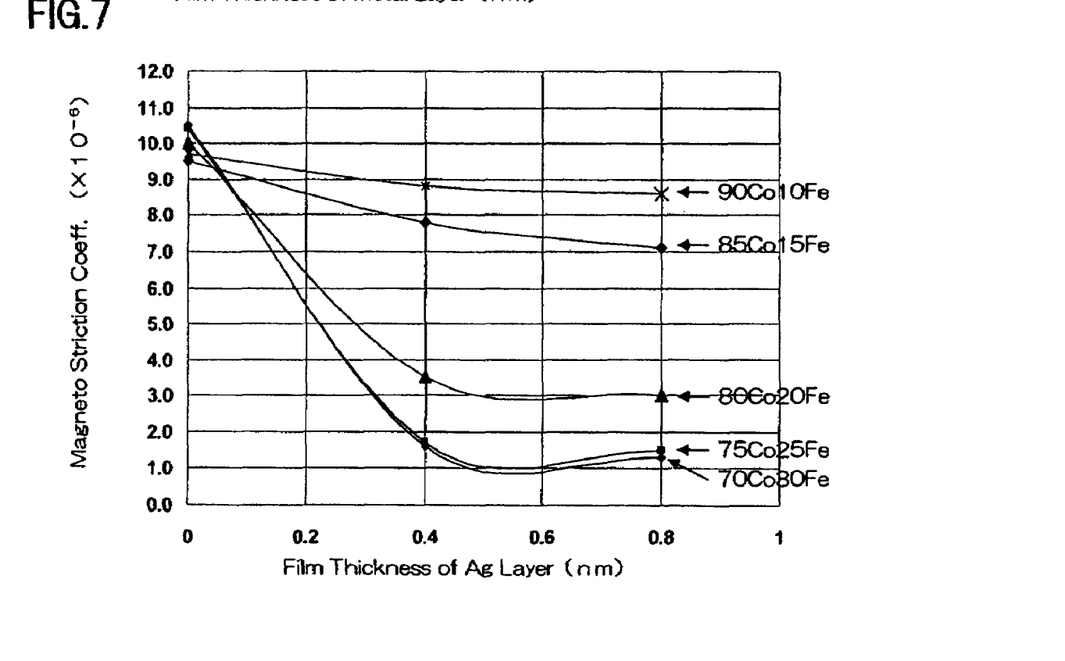

Referring to FIGS. 6, 7, the magneto striction coefficient varies depending on the atomic percent of Co in spacer adjoining layer 91. The magneto striction is significantly decreased when the atomic percent of Co is 70%. On the other hand, when the atomic percent of Co is 85% and 90%, the effect of adding silver is not sufficient to reduce the magneto striction coefficient to a practical level, although a certain level of reduction can be recognized. It is known that the crystal structure of spacer adjoining layer 91 forms the body centered cubic (bcc) structure or the face centered cubic (fcc) structure, depending on whether the atomic percent of Co is less than or more than approximately 80%, and it is thought that a bcc structure and the fcc structure coexist when the atomic percent of Co is 80%. Therefore, it should be appreciated from the foregoing that the difference in the atomic percent of Co actually reflects the difference in the crystal structure of CoFe, and that, in order to achieve a reduction in the magneto striction, it is important that CoFe has a bcc structure. The inventors think that because the silver layer is inserted and because spacer adjoining layer 91 has a bcc structure in the present invention, the silver layer is diffused into spacer layer 8, and magneto striction is reduced at the boundary.

TABLE 4

| Experiment. No. | Spacer Adjoining Layer 91 | Metal Layer 92 Material | Thickness (nm) | Heusler Alloy Layer 93 | Annealing Temp. (K) | Magneto striction Coefficient (×$10^{-6}$) | MR Ratio (%) |
| --- | --- | --- | --- | --- | --- | --- | --- |
| 3-1 | 70CoFe | Au | 0 | $Co_2MnSi$ | 563 | 10.5 | 7.2 |
| 3-2 | | | 0.1 | | | 11.0 | 7.0 |
| 3-3 | | | 0.2 | | | 2.5 | 7.1 |
| 3-4 | | | 0.4 | | | 1.0 | 7.7 |
| 3-5 | | | 0.8 | | | 0.9 | 7.9 |
| 3-6 | | | 1.2 | | | 2.3 | 7.6 |
| 3-7 | | | 1.6 | | | 3.8 | 7.4 |
| 3-8 | | | 2 | | | 5.0 | 7.1 |
| 4-1 | 70CoFe | Au | 0 | $Co_2MnGe$ | 563 | 12.3 | 7.5 |
| 4-2 | | | 0.1 | | | 13.0 | 7.4 |
| 4-3 | | | 0.2 | | | 2.9 | 7.3 |
| 4-4 | | | 0.4 | | | 1.9 | 7.9 |
| 4-5 | | | 0.8 | | | 1.2 | 7.9 |
| 4-6 | | | 1.2 | | | 2.2 | 7.7 |
| 4-7 | | | 1.6 | | | 4.1 | 7.2 |
| 4-8 | | | 2 | | | 6.0 | 7.1 |

(Experiment 3)

Although 70CoFe was used for spacer adjoining layer 91 in Experiments 1 and 2, the influence of the composition of CoFe on the magneto striation coefficient was evaluated by varying the composition of CoFe as a parameter in this experiment. Silver was used for metal layer 92, and gold was also used in some cases. The thickness of the silver layer was evaluated in three cases, i.e., 0 nm (silver was not provided), 0.4 nm, and 0.8 nm. In each case, the atomic percent of Co was varied from 70% to 90% in increments of 5%. Investigations were also conducted for some cases in which the Heusler alloy layer was made of $Co_2MnGe$, and for a case in which the thickness of the silver layer was 1.2 nm. Table 5 and FIGS. 6, 7 show the result of Experiment 3. FIG. 6 is a graph

TABLE 5

| Experiment. No. | Spacer Adjoining Layer 91 Composition | Co (at %) | Metal Layer 92 Material | Thickness (nm) | Heusler Alloy Layer 93 | Annealing Temp. (K) | Magneto striction Coefficient (×$10^{-6}$) |
| --- | --- | --- | --- | --- | --- | --- | --- |
| 1-1 | 70CoFe | 70 | Ag | 0 | $Co_2MnSi$ | 563 | 10.5 |
| 7-2 | 75CoFe | 75 | | | | | 10.4 |

TABLE 5-continued

| Experiment. No. | Spacer Adjoining Layer 91 | | Metal Layer 92 | | Heusler Alloy Layer 93 | Annealing Temp. (K) | Magneto striction Coefficient (×10⁻⁶) |
|---|---|---|---|---|---|---|---|
| | Composition | Co (at %) | Material | Thickness (nm) | | | |
| 7-3 | 80CoFe | 80 | | | | | 10.0 |
| 7-4 | 85CoFe | 85 | | | | | 9.5 |
| 7-5 | 90CoFe | 90 | | | | | 9.7 |
| 1-4 | 70CoFe | 70 | Ag | 0.4 | Co₂MnSi | 563 | 1.6 |
| 8-2 | 75CoFe | 75 | | | | | 1.7 |
| 8-3 | 80CoFe | 80 | | | | | 3.5 |
| 8-4 | 85CoFe | 85 | | | | | 7.8 |
| 8-5 | 90CoFe | 90 | | | | | 8.8 |
| 1-5 | 70CoFe | 70 | Ag | 0.8 | Co₂Mnsi | 563 | 1.3 |
| 9-2 | 75CoFe | 75 | | | | | 1.5 |
| 9-3 | 80CoFe | 80 | | | | | 3.0 |
| 9-4 | 85CoFe | 85 | | | | | 7.1 |
| 9-5 | 90CoFe | 90 | | | | | 8.6 |
| 10-1 | 90CoFe | 90 | Ag | 1.2 | Co₂MnSi | 563 | 8.2 |
| 11-1 | 90CoFe | 90 | Ag | 0.4 | Co₂MnGe | 563 | 9.1 |
| 11-2 | | | | 0.8 | | | 8.8 |
| 11-3 | | | | 1.2 | | | 8.8 |
| 12-1 | 90CoFe | 90 | Au | 0.4 | Co₂MnSi | 563 | 10.8 |
| 12-2 | | | | 0.8 | | | 11.2 |
| 12-3 | | | | 1.2 | | | 11.1 |

(Experiment 4)

Figure 8:
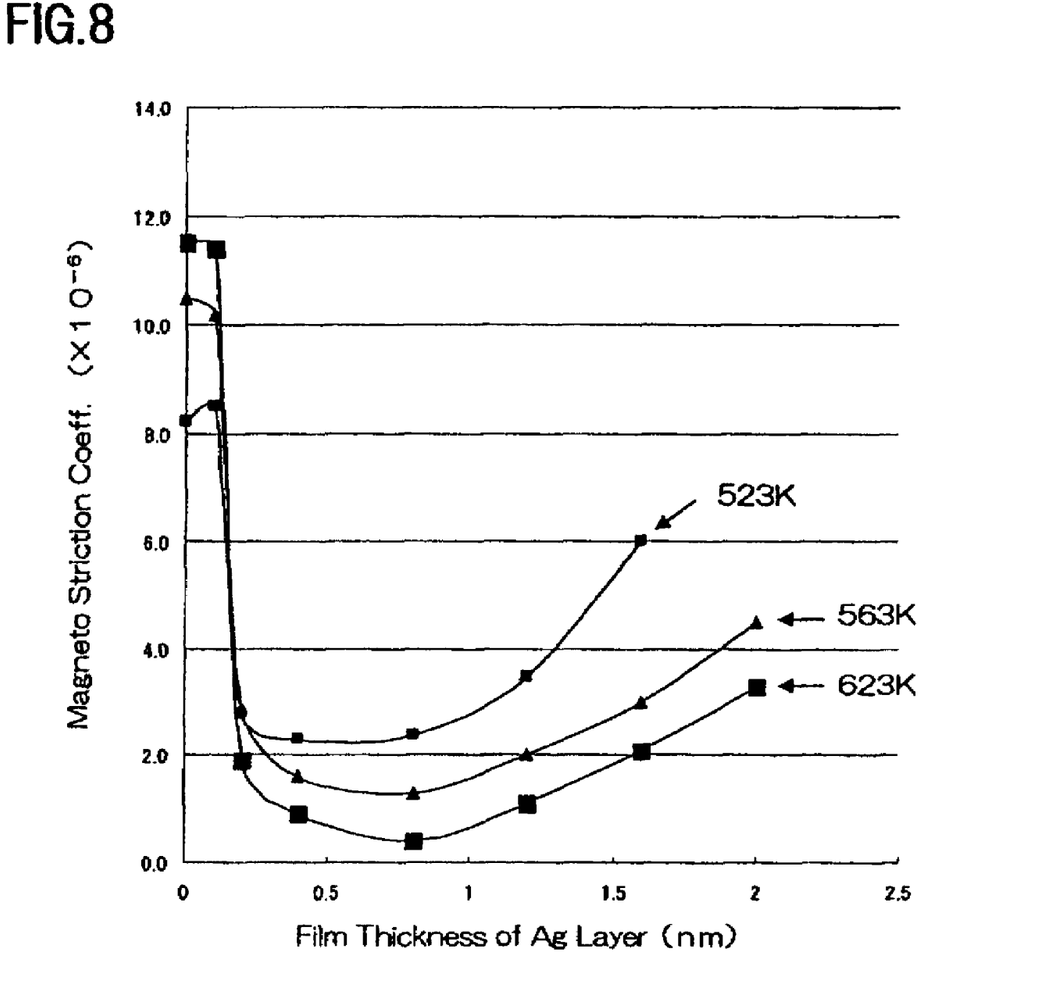
FIG. 8 is graph showing the result of Experiment 4.

Next, the influence of the annealing temperature on the magneto striction coefficient was investigated. Metal layer 92 was made of silver. Spacer adjoining layer 91 was made of 70CoFe, and Heusler alloy layer 93 was made of Co₂MnSi. Table 6 and FIG. 8 show the result of Experiment 4. In FIG. 8, the cases in which the annealing temperature is 563 K (290° C.) are the same as in Experiment 1. It is confirmed from the test results that magneto striction tends to be decreased in accordance with an increase in the annealing temperature. In order to achieve a magneto striction coefficient that is less than +3×10⁻⁶, the thickness has to be 1.1 nm or less when the annealing temperature is 523 K (250° C.), and has to be 1.6 nm or less when the annealing temperature is 563 K (290° C.), and has to be 1.9 nm or less when the annealing temperature is 623 K (350° C.). It is thought that magneto striction tends to be decreased at a higher annealing temperature because the diffusion of silver is promoted and thus a reduction in magneto striction is advanced at the boundary. It should be noted that this test result can support the theory that magneto striction is reduced at the boundary due to the insertion of the silver layer and the diffusion of silver.

TABLE 6

| Experiment. No. | Spacer Adjoining Layer 91 | Metal Layer 92 | | Heusler Alloy Layer 93 | Annealing Temp. (K) | Magneto striction Coefficient (×10⁻⁶) |
|---|---|---|---|---|---|---|
| | | Material | Thickness (nm) | | | |
| 5-1 | 70CoFe | Ag | 0 | Co₂MnSi | 523 | 8.2 |
| 5-2 | | | 0.1 | | | 8.5 |
| 5-3 | | | 0.2 | | | 2.8 |
| 5-4 | | | 0.4 | | | 2.3 |
| 5-5 | | | 0.8 | | | 2.4 |
| 5-6 | | | 1.2 | | | 3.5 |
| 5-7 | | | 1.6 | | | 6.0 |
| 1-1 | 70CoFe | Ag | 0 | Co₂MnSi | 563 | 10.5 |
| 1-2 | | | 0.1 | | | 10.2 |
| 1-3 | | | 0.2 | | | 2.9 |
| 1-4 | | | 0.4 | | | 1.6 |
| 1-5 | | | 0.8 | | | 1.3 |
| 1-6 | | | 1.2 | | | 2.0 |
| 1-7 | | | 1.6 | | | 3.0 |
| 1-8 | | | 2 | | | 4.5 |
| 6-1 | 70CoFe | Ag | 0 | Co₂MnSi | 623 | 11.5 |
| 6-2 | | | 0.1 | | | 11.4 |
| 6-3 | | | 0.2 | | | 1.9 |
| 6-4 | | | 0.4 | | | 0.9 |
| 6-5 | | | 0.8 | | | 0.4 |
| 6-6 | | | 1.2 | | | 1.1 |
| 6-7 | | | 1.6 | | | 2.1 |
| 6-8 | | | 2 | | | 3.3 |

Figure 9A:
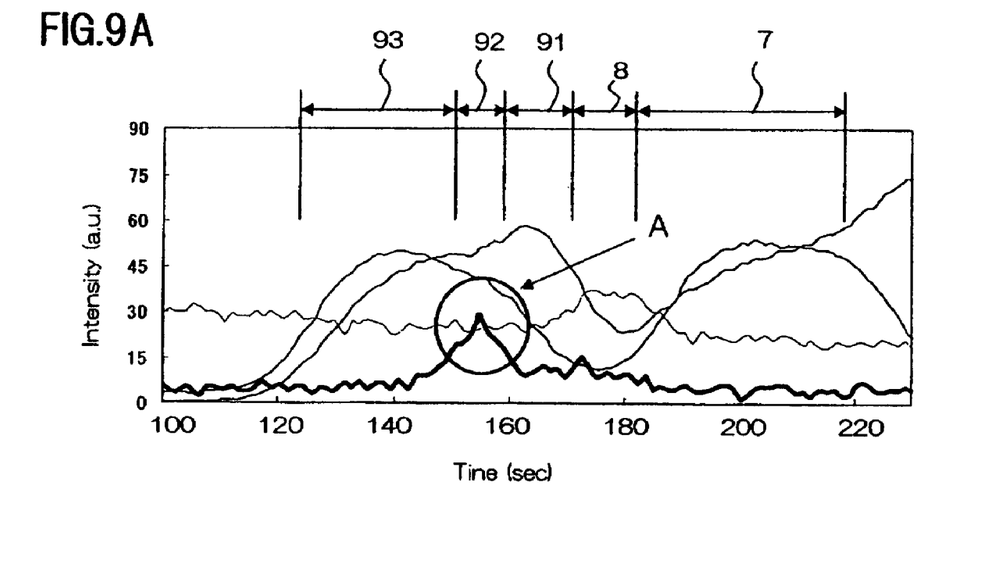
FIGS. 9A and 9B are graphs showing the result of a mass spectrometry based on SIMS.
Figure 9B:
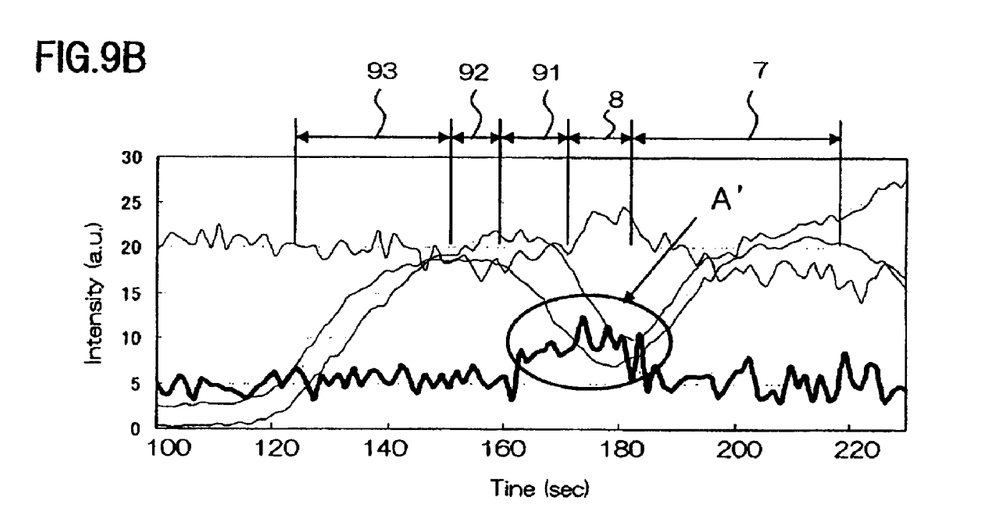

Finally, the situation in which silver was actually diffused into the spacer layer was confirmed. FIGS. 9A and 9B are charts showing the distributions of elements at locations between the spacer layer and the Heusler alloy layer. The charts were created be means of a secondary ion mass spectroscopy (SIMS). The horizontal axis represents time. In each graph, time corresponds to the milling time, and therefore, to the location of each layer which was determined from the elements that were detected. FIG. 9A shows the state before annealing, and FIG. 9B shows the state after annealing. Before annealing, silver is concentrated in the vicinity of metal layer 92, as indicated by circle A in FIG. 9A. On the other hand, after annealing, silver is diffused over the area between spacer adjoining layer 91 and spacer layer 8, as indicated in ellipse A' in FIG. 9B It was confirmed from the result of the SIMS-based mass spectroscopy that silver is diffused under the influence of annealing.

Although an embodiment of a bottom type CPP-GMR element has been described, the present invention can also be applied to a top type. In a top type CPP-GMR element, the diffusion of metal, such as silver, occurs in a similar manner, and similar effects can be achieved as well, as long as the relative relationship among spacer layer 8, spacer adjoining layer 91, metal layer 92, and Heusler alloy layer 9 is similar to that of the embodiment described above. Further, the pinned layer need not be a synthetic pinned layer, and may be constructed as a pinned layer of a single layer type, in which the anti-ferromagnetic coupling is not utilized.

Figure 10:
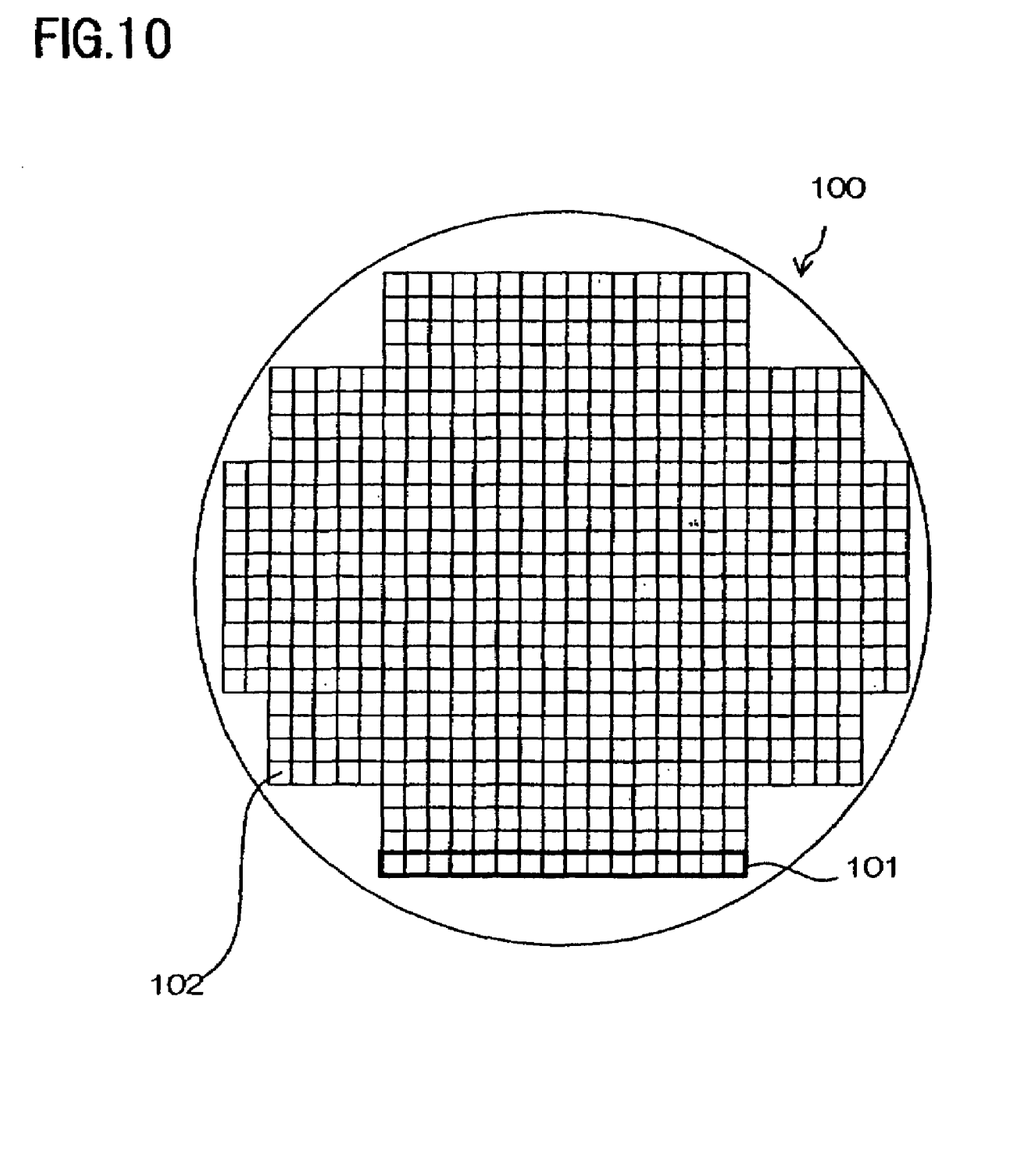
FIG. 10 is a plan view of a wafer which is used for manufacturing a slider of the present invention.

Next, explanation will be made regarding a wafer for fabricating a thin-film magnetic head described above. FIG. 10 is a schematic plan view of a wafer. Wafer 100 has a plurality of thin-film magneto-electric transducers 102 which includes at least thin-film magnetic head 1. Wafer 100 is diced into bars 101, in which a plurality of thin-film magneto-electric transducers 102 are formed in a row. Bar 101 serves as a working unit in the process of forming ABS. After lapping, bar 101 is diced into sliders such that each slider has thin-film magnetic head 1. Dicing portions, not shown, are provided in wafer 100 in order to dice wafer 100 into bars 101 and into sliders.

Figure 11:
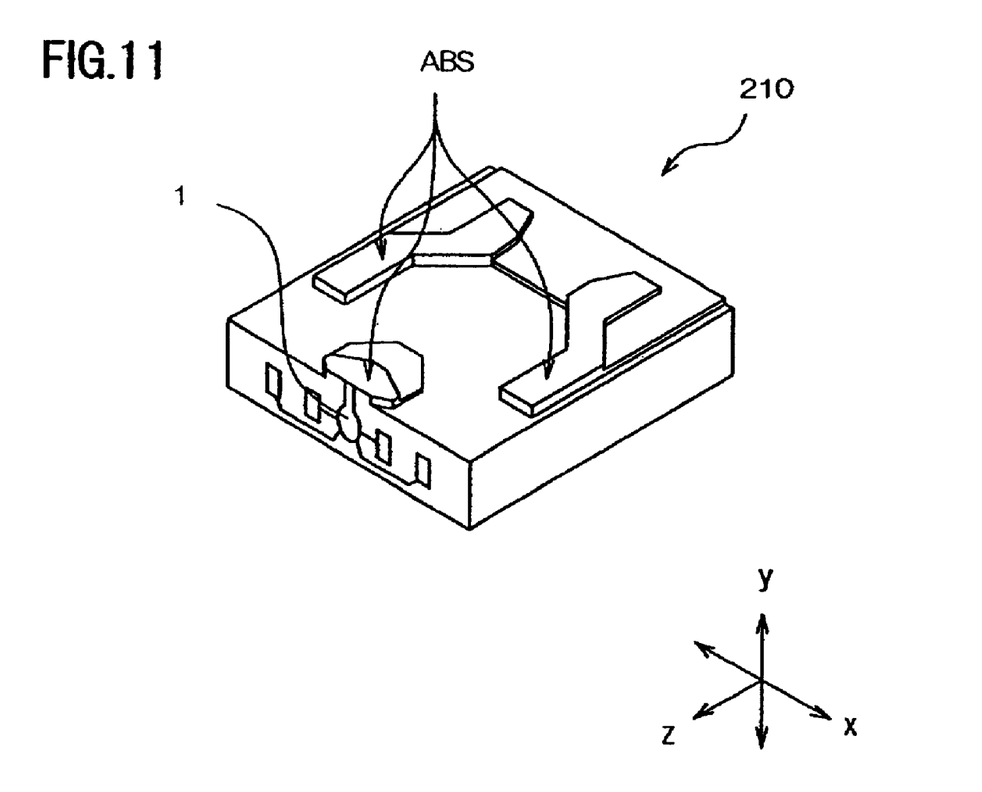
FIG. 11 is a perspective view of a slider of the present invention which is included in a head gimbal assembly.

Explanation next regards a head gimbal assembly and a hard disk drive that uses the thin-film magnetic head. Referring to FIG. 11, slider 210 which is included in the head gimbal assembly will be described first. In a hard disk drive, slider 210 is an assembly of stacked layers that is arranged opposite to a hard disk, which is a rotationally-driven disc-shaped storage medium. Slider 210 has a substantially hexahedral shape. One of the six surfaces of slider 210 forms ABS, which is positioned opposite to the hard disk. When the hard disk rotates in the z direction shown in FIG. 11, airflow which passes between the hard disk and slider 210 creates a dynamic lift, which is applied to slider 210 downward in the y direction of FIG. 11. Slider 210 is configured to lift up from the surface of the hard disk because of this dynamic lift effect. In proximity to the trailing edge (the end portion at the lower left in FIG. 11) of slider 210, which is on the outlet side of the airflow, thin-film magnetic head 1 is formed.

Figure 12:
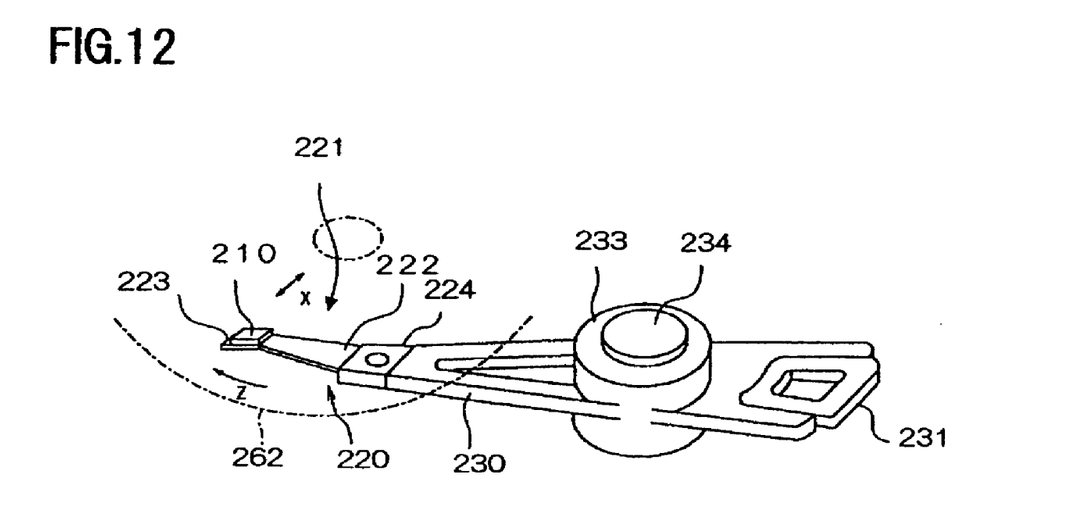
FIG. 12 is a perspective view of a head gimbal assembly which includes a slider of the present invention.

Referring to FIG. 12, head gimbal assembly 220 that has the thin-film magnetic head will be explained next. Head gimbal assembly 220 is provided with slider 210 and suspension 221 for resiliently supporting slider 210. Suspension 221 has; load beam 222 in the shape of a flat spring and made of, for example, stainless steel; flexure 223 attached to one end of load beam 222, and to which slider 210 is fixed, while providing an appropriate degree of freedom to slider 210; and base plate 224 provided on the other end of load beam 222.

The portion of flexure 223 to which slider 210 is attached has a gimbal section for maintaining slider 210 in a fixed orientation.

The arrangement in which a head gimbal assembly 220 is attached to a single arm 230 is called a head arm assembly. Arm 230 moves slider 210 in transverse direction x with regard to the track of hard disk 262. One end of arm 230 is attached to base plate 224. Coil 231, which constitutes a part of a voice coil motor, is attached to the other end of arm 230. In the intermediate portion of arm 230, bearing section 233 which has shaft 234 to rotatably hold arm 230 is provided. Arm 230 and the voice coil motor to drive arm 230 constitute an actuator.

Figure 13:
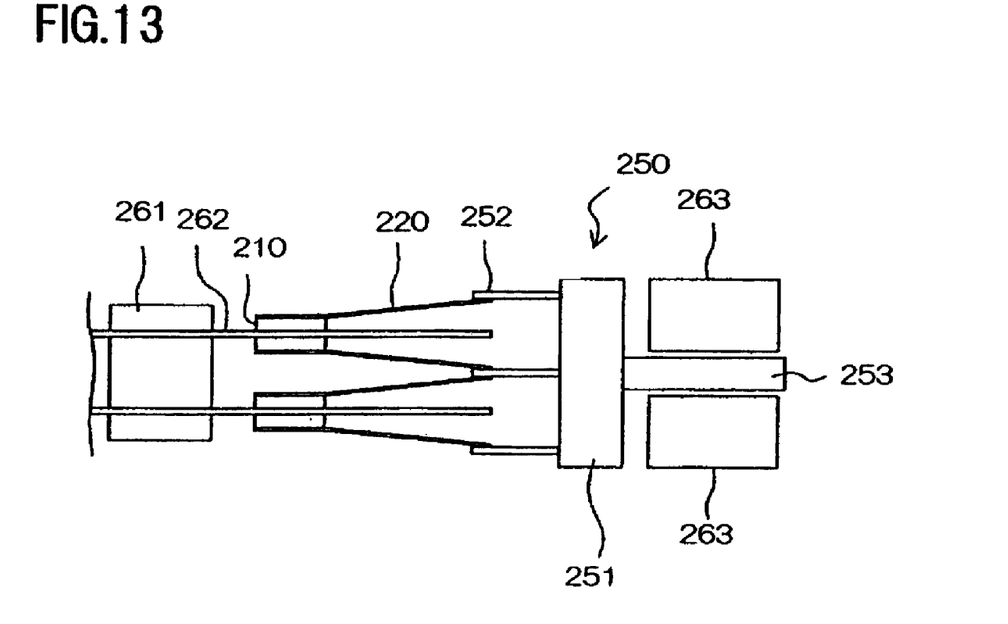
FIG. 13 is a side view of the essential part of a hard disk drive which includes a slider of the present invention.
Figure 14:
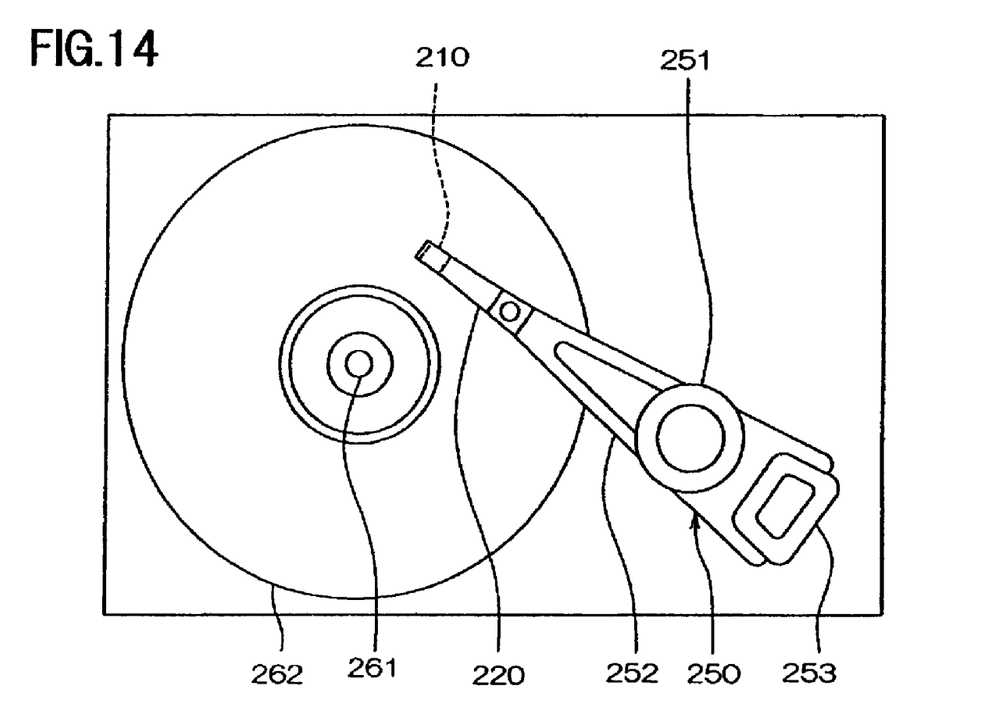
FIG. 14 is a plan view of a hard disk drive which includes a slider of the present invention.

Referring to FIG. 13 and FIG. 14, a head stack assembly and a hard disk drive that use the thin-film magnetic head as a head element will be explained next. The arrangement in which head gimbal assemblies 220 are attached to the respective arm of a carriage having a plurality of arms is called a head stack assembly. FIG. 13 is an explanatory diagram illustrating an essential part of a hard disk drive, and FIG. 14 is a plan view of the hard disk drive. Head stack assembly 250 has carriage 251 provided with a plurality of arms 252. A plurality of head gimbal assemblies 220 are attached to a plurality of arms 252 such that head gimbal assemblies 220 are arranged apart from each other in the vertical direction. Coil 253, which constitutes a part of the voice coil, is attached to carriage 251 on the side opposite to arms 252. The voice coil motor has permanent magnets 263 which are arranged in positions opposite to each other interposing coil 253 of head stack assembly 250 therebetween.

Referring to FIG. 14, head stack assembly 250 is installed in a hard disk drive. The hard disk drive has a plurality of hard disks connected to spindle motor 261. Two sliders 210 are arranged per each hard disk 262 at positions opposite to each other interposing hard disk 262 therebetween. Head stack assembly 250 and the actuator, except for sliders 210, work as a positioning device. They carry sliders 210 and work to position sliders 210 relative to hard disks 262. Sliders 210 are moved by the actuator in the transverse direction with regard to the tracks of hard disks 262, and positioned relative to hard disks 262. Thin-film magnetic head 1 that is contained in slider 210 records information to hard disk 262 using write head portion, and reads information recorded in hard disk 262 using the read head portion.

Although a certain preferred embodiment of the present invention has been shown and described in detail, it should be understood that various changes and modifications may be made without departing from the spirit or scope of the appended claims.

What is claimed is:

1. A method for manufacturing a magnetic field detecting element having a free layer whose magnetization direction changes in accordance with an external magnetic field, a pinned layer whose magnetization direction is fixed with respect to said external magnetic field, and a non-magnetic spacer layer which is interposed between said free layer and said pinned layer, wherein sense current is adapted to flow in a direction that is perpendicular to layer surfaces, said method comprising the steps of:

forming stacked layers by sequentially depositing said pinned layer, said spacer layer, a spacer adjoining layer which is adjacent to said spacer layer, a metal layer, and a Heusler alloy layer in this order, such that said layers adjoin each other; and heat treating said stacked layers in order to form said free layer out of said spacer adjoining layer, said metal layer, and said Heusler alloy layer, wherein said spacer adjoining layer is mainly formed of cobalt and iron, and has a body centered cubic structure, and wherein said metal layer is formed of an element selected from the group consisting of silver, gold, copper, palladium, or platinum, or is formed of an alloy thereof.

2. The method according to claim 1, wherein said metal layer has a thickness between 0.2 nm and 1.2 nm.

3. The method according to claim 2, wherein an atomic percent of cobalt in said spacer adjoining layer is more than 0% and is equal to or less than 75%.

4. The method according to claim 1, wherein an atomic percent of cobalt in said spacer adjoining layer is more than 0% and is equal to or less than 75%.

5. A magnetic field detecting element comprising:
a free layer whose magnetization direction changes in accordance with an external magnetic field;
a pinned layer whose magnetization direction is fixed with respect to said external magnetic field; and
a non-magnetic spacer layer which is sandwiched between said free layer and said pinned layer,
wherein sense current is adapted to flow in a direction that is perpendicular to layer surfaces,
said free layer comprises:
a spacer adjoining layer; and
a Heusler alloy layer, wherein said spacer adjoining layer is sandwiched between said spacer layer and said Heusler alloy layer,
wherein said spacer adjoining layer is mainly formed of cobalt and iron, and has a body centered cubic structure, and
wherein said spacer layer contains an element selected from the group consisting of silver, gold, copper, palladium, or platinum, or an alloy thereof, wherein said element or said alloy was diffused from a region between said spacer adjoining layer and said Heusler alloy layer.

6. The magnetic field detecting element according to claim 5, wherein said Heusler alloy layer is adjacent to said spacer adjoining layer.

7. The magnetic field detecting element according to claim 6, wherein an atomic percent of cobalt in said spacer adjoining layer is more than 0% and is equal to or less than 75%.

8. The magnetic field detecting element according to claim 5, further comprising a metal layer between said Heusler alloy layer and said spacer adjoining layer, said metal layer containing an element selected from the group consisting of silver, gold, copper, palladium, or platinum, or an alloy thereof.

9. The magnetic field detecting element according to claim 8, wherein an atomic percent of cobalt in said spacer adjoining layer is more than 0% and is equal to or less than 75%.

10. The magnetic field detecting element according to claim 5, wherein an atomic percent of cobalt in said spacer adjoining layer is more than 0% and is equal to or less than 75%.

11. A slider comprising the magnetic field detecting element according to claim 5.

12. A wafer which is used to manufacture said slider according to claim 11, said wafer being provided with at least one of said magnetic field detecting elements.

13. A head gimbal assembly comprising:
a slider according to claim 11, said slider being configured to be arranged opposite to a recording medium; and
a suspension for resiliently supporting said slider.

14. A hard disk drive comprising:
a slider according to claim 11, the slider being configured to be arranged opposite to a disc-shaped recording medium that is rotatably driven; and
a positioning device for supporting said slider and for positioning said slider relative to said recording medium.

* * * * *